United States Patent
Shibata (10) Patent No.: US 12,527,145 B2
(45) Date of Patent: Jan. 13, 2026

(54) ANALOG AMPLIFIER

(71) Applicants: CHIRACOL Co., LTD., Saitama (JP); ORGANO SCIENCE CO., LTD., Omaezaki (JP)

(72) Inventor: Toshihiro Shibata, Saitama (JP)

(73) Assignees: CHIRACOL CO., LTD., Saitama (JP); ORGANO SCIENCE CO., LTD., Omaezaki (JP)

( * ) Notice: Subject to any disclaimer, the term of this patent is extended or adjusted under 35 U.S.C. 154(b) by 539 days.

(21) Appl. No.: 17/988,918

(22) Filed: Nov. 17, 2022

(65) Prior Publication Data
US 2023/0157038 A1   May 18, 2023

(30) Foreign Application Priority Data
Nov. 18, 2021 (JP) .................. 2021-188214

(51) Int. Cl.
*H01L 29/08* (2006.01)
*H03F 3/181* (2006.01)
(Continued)

(52) U.S. Cl.
CPC ....... *H10K 10/466* (2023.02); *H10K 85/6576* (2023.02)

(58) Field of Classification Search
CPC ............. H10K 10/466; H10K 85/6576; H10K 10/484; H03F 2200/03; H03F 3/181; H03F 3/20

(Continued)

(56) References Cited

U.S. PATENT DOCUMENTS

| | | | |
|---|---|---|---|
| 7,528,654 B2 * | 5/2009 | Sicurella | H03F 3/16 330/253 |
| 11,296,661 B2 * | 4/2022 | Wakaki | H03F 1/223 |
| 2022/0223792 A1 | 7/2022 | Honma et al. | |

FOREIGN PATENT DOCUMENTS

| | | |
|---|---|---|
| JP | 6-34322 U | 5/1994 |
| JP | 2018-29312 A | 2/2018 |

(Continued)

OTHER PUBLICATIONS

"Chiracol Uses Organic Semiconductors in Amplifiers to Achieve Clear Sound Quality", The Nikkan Kogyo Shimbun, Ltd. (The Daily Industrial News), Jun. 25, 2021, https://www.nikkan.co.jp/articles/view/00603144.

*Primary Examiner* — Hieu P Nguyen
(74) *Attorney, Agent, or Firm* — Birch, Stewart, Kolasch & Birch, LLP (57) ABSTRACT

An object of the present invention is to apply an organic thin-film transistor, which is produced using an organic semiconductor material, to an analog amplifier. The analog amplifier according to the present invention includes: a first amplifier (2) which voltage-amplifies an analog signal to be amplified; and a second amplifier (6) which power-amplifies the thus amplified signal output from the first amplifier to generate a drive signal that drives an equipment (10). The first amplifier includes an organic semiconductor amplifier element, namely an organic thin-film field-effect transistor (4), in which a semiconductor layer forming a channel is composed of an organic semiconductor. An organic semiconductor material is solvent-soluble and thus can be applied to form a film by a printing method such as an ink-jet method. Therefore, the production thereof can be carried out using a simple production facility.

5 Claims, 3 Drawing Sheets

(51) Int. Cl.
*H10K 10/46* (2023.01)
*H10K 85/60* (2023.01)

(58) Field of Classification Search
USPC .................................... 330/250, 307, 310
See application file for complete search history.

(56) References Cited

FOREIGN PATENT DOCUMENTS

| | | | |
|---|---|---|---|
| JP | 2019-220642 A | 12/2019 | |
| JP | 7521742 B2 | 7/2024 | |

\* cited by examiner

ANALOG AMPLIFIER

CROSS REFERENCE TO RELATED APPLICATIONS

This non-provisional application claims the benefit under 35 U.S.C. § 119(a) to Patent Application No. JP2021-188214, filed in Japan on Nov. 18, 2021, all of which is hereby expressly incorporated by reference into the present application.

TECHNICAL FIELD

The present invention relates to an analog amplifier which amplifies analog signals using an organic semiconductor amplifier element.

BACKGROUND ART

The production of a field-effect transistor using amorphous silicon or polycrystalline silicon requires a large number of vacuum apparatuses and impurity injection apparatuses. Thus, a large-scale production facility is needed, and this leads to a high production cost. As a means for solving this problem, organic thin-film transistors in which an organic semiconductor material is used in a semiconductor layer (active layer) forming a channel is expected to be put into practical use (see, for example, Patent Document 1).

Organic semiconductor materials are solvent-soluble and thus can be applied to form a film by a printing process. In other words, an organic transistor can be produced using a printing technology, and circuit fabrication can be carried out at a low cost and in a short time. Therefore, organic semiconductor materials are suitable for producing a wide variety of products in small lots using a small-scale production facility.

RELATED ART DOCUMENT

Patent Document

[Patent Document 1] JP2019-220642A

SUMMARY OF THE INVENTION

Problems to be Solved by the Invention

At present, the development of an organic transistor places a primary focus on general-purpose digital circuits such as driver circuits and logic circuits mainly for large-sized displays. Meanwhile, in the field of analog technology, it is desired to produce various amplifier elements having different properties in small lots. Particularly, in the field of audio amplifiers, it is demanded to produce transistors having various amplification characteristics in small lots. In such a case, a capability of producing transistors at a low cost using a simple production facility can contribute to the advancement of analog amplifiers.

On another front, as described above, organic semiconductor materials can be applied to form a film by a printing process and produced using a simple production facility. Therefore, the benefit of being able to produce an analog amplifier in a simple and low-cost manner is achieved if an organic thin-film transistor can be utilized in the analog amplifier.

An object of the present invention is to apply an organic thin-film transistor, which is produced using an organic semiconductor material, to an analog amplifier.

Means for Solving the Problems

The analog amplifier according to the present invention includes: a first amplifier which voltage-amplifies an input analog signal; and a second amplifier which power-amplifies the thus amplified signal output from the first amplifier to generate a drive signal that drives an equipment, the analog amplifier being characterized in that the first amplifier includes an organic semiconductor amplifier element in which a semiconductor layer forming a channel is composed of an organic semiconductor.

A preferred analog amplifier according to the present invention is characterized in that: the input analog signal is an audio signal output from a sound reproduction device; the audio signal is voltage-amplified by the first amplifier; the second amplifier power-amplifies the thus voltage-amplified audio signal to generate a drive signal that drives an audio equipment; and the analog amplifier operates as an audio amplifier.

Another preferred analog amplifier according to the present invention is characterized in that: the input analog signal is an audio signal generated from a cartridge of a record player; the first amplifier includes a series connection of a step-up transformer and an organic thin-film field-effect transistor; and the input analog signal is amplified by the step-up transformer and then further amplified by the organic thin-film field-effect transistor.

Yet another preferred analog amplifier according to the present invention is characterized in that the organic semiconductor is an organic transistor material having a trans-1,4-cyclohexane structure derived from a compound represented by the following Formula (1):

where

X represents a skeleton in which plural phenylene groups or naphthylene groups are linked directly or via a vinyl group, a condensed polycyclic hydrocarbon skeleton, or a heterocyclic compound skeleton;

m, n, p, and q each independently represent 0 or 1; and

R1 and R2 each independently represent an alkyl group or haloalkyl group having 1 to 15 carbon atoms.

Effects of the Invention

The organic thin-film field-effect transistor according to the present invention exhibits a voltage amplification function; therefore, an analog amplifier suitable for amplifying a low-output analog signal to a desired signal level can be realized.

DETAILED DESCRIPTION OF THE INVENTION

Figure 1:
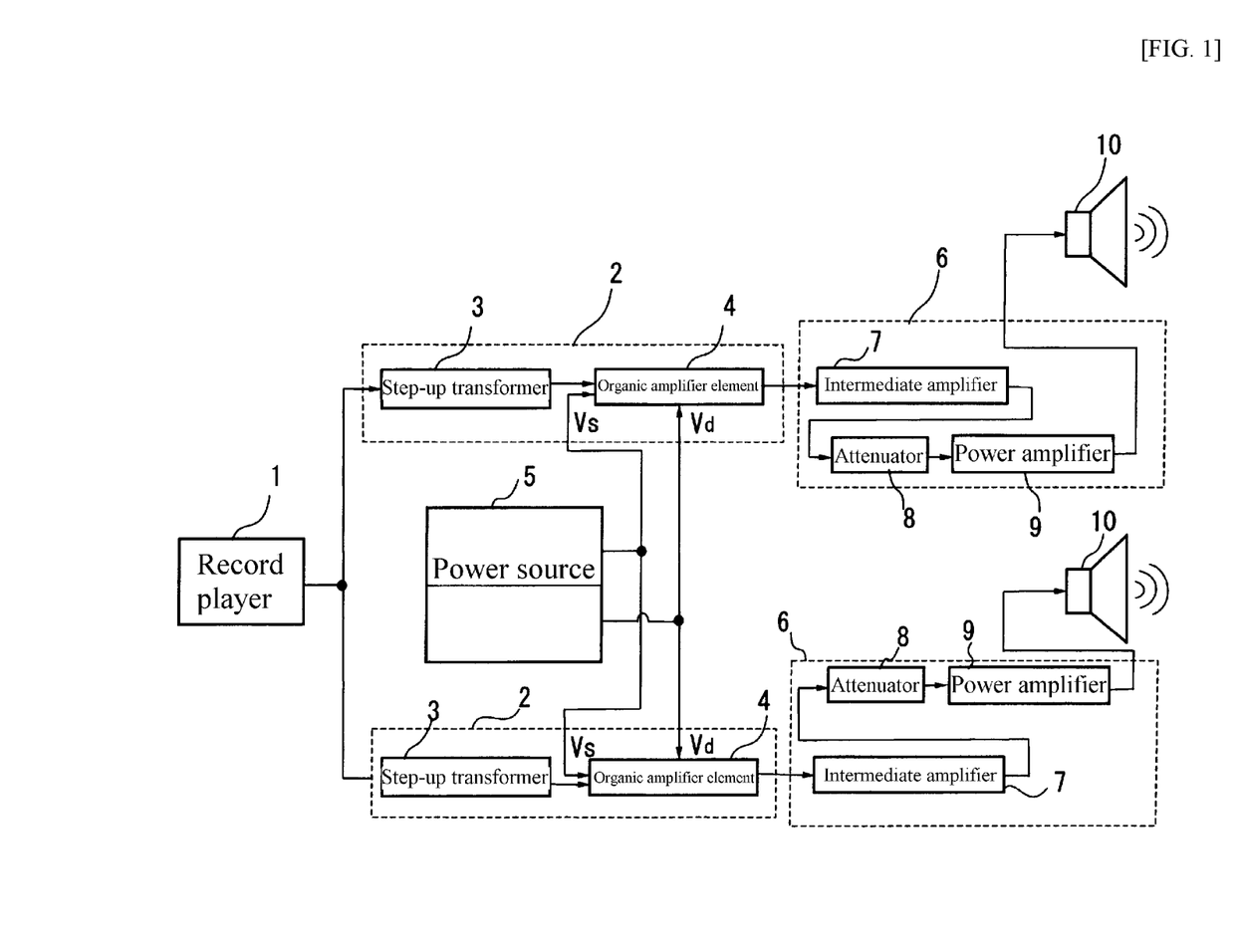
FIG. 1 is a diagram illustrating one example of the analog amplifier according to the present invention.

FIG. 1 is a diagram illustrating the constitution of one example of the analog amplifier according to the present invention. In this example, an audio amplifier, which amplifies an audio signal generated from a sound reproduction device such as a record player will be described. It is noted here that the following descriptions are made using the same symbols for both R and L channels. An audio signal generated from a cartridge of a record player 1 is input to a first amplifier 2. The audio signal generated from the cartridge of the record player is a lower output signal than an audio signal of other line level. Therefore, voltage amplification is performed using the first amplifier in such a manner to conform to the signal level of a downstream amplifier.

The first amplifier 2 has a series connection of a step-up transformer 3 and an organic amplifier element (organic thin-film field-effect transistor) 4, and performs voltage amplification in two steps. The input audio signal is amplified by the step-up transformer 3 to a prescribed signal level, and then voltage-amplified by the organic amplifier element 4 to a voltage level conforming to that of a downstream power amplifier. By performing voltage amplification using the series connection of the step-up transformer and the organic field-effect transistor in this manner, a sufficient amount of amplification can be ensured since, even if the amount of amplification by the step-up transformer is insufficient, the input audio signal can be further amplified by the organic field-effect transistor. When the organic field-effect transistor provides a sufficient amount of amplification, it can be configured to perform amplification in one step without the step-up transformer 3, or without being connected to the step-up transformer 3. Nevertheless, when the cartridge of the record player 1 is an MC (Moving Coil) cartridge, the audio signal has an output of about several millivolts (mV) and is thus a lower output signal than a signal generated by an MM (Moving Magnet) cartridge; therefore, the voltage amplification is preferably performed in two steps using the step-up transformer 3 and an organic thin-film field-effect transistor. The organic amplifier element 4 is constituted by an organic thin-film field-effect transistor. As the organic thin-film field-effect transistor, either a junction field-effect transistor or a MOS field-effect transistor can be used.

A power source 5 is arranged for driving the organic field-effect transistor. The power source 5 generates a bias voltage Vs and a drain voltage Vd for a gate bias. The output from the step-up transformer 3 and the bias voltage Vs output from the power source 5 are applied to a gate electrode of the organic transistor 4, while the drain voltage Vd is applied to a drain electrode. A source electrode is grounded via a load resistor (not illustrated).

A source voltage (amplified signal) generated by the source electrode of the organic transistor 4 is supplied to a second amplifier as an output of the first amplifier. The second amplifier may be, for example, a premain amplifier or a main amplifier. The second amplifier 6 includes an intermediate amplifier 7, an attenuator 8, and a power amplifier 9. The intermediate amplifier 7 can have a function of phono-equalizing the audio signal that is output from the record player 1 and amplified by the organic transistor 4. This phono-equalizer function may be integrated into the first amplifier instead of the intermediate amplifier 7. The amplified signal output from the first amplifier is amplified by the intermediate amplifier to a prescribed signal level, and then supplied to the attenuator 8. The attenuator adjusts the input signal in such a manner to conform to the signal level of the downstream power amplifier. The power amplifier 9 power-amplifies the input signal and thereby generates a drive signal that drives a speaker 10.

Figure 2:
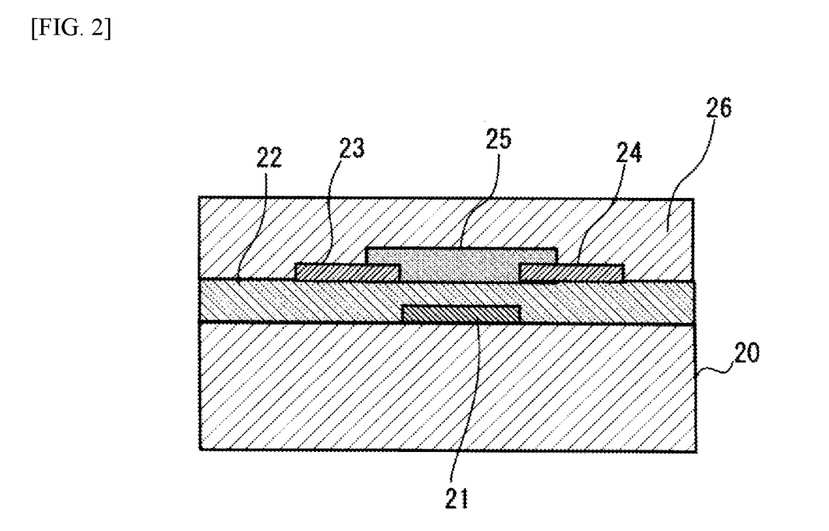
FIG. 2 is a cross-sectional view illustrating one example of the organic field-effect transistor according to the present invention.

FIG. 2 is a cross-sectional view illustrating one example of the organic thin-film field-effect transistor according to the present invention. In this example, a top-gate MOSFET will be described as an example. A substrate 20 is prepared. As this substrate, various substrates such as a glass substrate, a plastic substrate, and a silicon substrate can be used. On the substrate 20, a gate electrode 21 is formed at a thickness of 50 nm. This gate electrode is formed by vapor deposition of an aluminum layer on the substrate.

On the surface of the substrate on which the gate electrode has thus been formed, a gate insulating film 22 is formed. As this gate insulating film, an insulating polymer such as polymethyl methacrylate, polystyrene, polyimide, or poly-p-xylylene is applied by an ink-jet method. The insulating polymer is solvent-soluble and thus can be applied to form a film by an ink-jet method.

On the gate insulating film 22, a source electrode 23 and a drain electrode 24 are formed. These source electrode and drain electrode are arranged to face each other such that they are apart by a prescribed channel length. The channel length is, for example, 0.1 to 100 Further, the channel width is 30 to 200 As a material of these electrodes, a metal such as gold, platinum, silver, aluminum, or chromium, or an alloy containing these metals can be used.

An organic semiconductor layer 25 is formed in such a manner to cover the source electrode and the drain electrode as well as a channel region. Since an organic semiconductor material is solvent-soluble, the organic semiconductor layer is also formed by applying the material by an ink-jet method. As a printing method other than an ink-jet method, for example, a nano-printing method, a flexographic printing method, a relief printing method, an offset printing method, a planographic printing method, or a gravure printing method can be utilized.

With regard to the arrangement positions of the electrodes, the electrodes are formed at such positions that the channel region formed in the semiconductor layer (active layer) and the gate electrode face each other via the gate insulating film.

After the formation of the source electrode and the drain electrode, a passivation layer 26 is formed in such a manner to cover the entire surface.

An organic semiconductor can be an organic transistor material having a trans-1,4-cyclohexane structure derived from a compound represented by the following Formula (1):

where
- X represents a skeleton in which plural phenylene groups or naphthylene groups are linked directly or via a vinyl group, a condensed polycyclic hydrocarbon skeleton, or a heterocyclic compound skeleton;
- m, n, p, and q each independently represent 0 or 1; and
- R1 and R2 each independently represent an alkyl group or haloalkyl group having 1 to 15 carbon atoms.

The above-described organic transistor material having a trans-1,4-cyclohexane structure derived from a compound represented by Formula (1) will now be described more concretely.

The organic transistor material is a derivative in which a skeleton X used as an organic transistor material has a cyclohexyl group, which is a six-membered cycloalkyl group and has an alkyl group or haloalkyl group side chain (such a cyclohexyl group is hereinafter also referred to as "alkylcyclohexyl group"), as a substituent; therefore, the organic transistor material exhibits higher carrier mobility and superior thermal stability as compared to conventional organic transistor materials, and has a solubility that allows coating.

The alkyl group constituting a side chain of the alkylcyclohexyl group has 1 to 15, preferably 1 to 10 carbon atoms. The alkyl group may have a straight-chain structure; however, it is optionally branched. Examples of the alkyl group include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, and an n-pentadecyl group. By using an electron-donating alkyl group, not only the solubility in organic solvents can be improved and the molecular arrangement can be controlled but also the wettability to a substrate to be coated can be controlled and the highest occupied molecular orbital (HOMO) level can be increased, allowing the organic transistor material to function as a p-type semiconductor.

The side chain may also be a haloalkyl group in which a hydrogen atom of an alkyl group is substituted with a halogen atom. Examples of the halogen atom of the haloalkyl group include a fluorine atom, a chlorine atom, a bromine atom, and an iodine atom. The haloalkyl group may contain one or a plurality of these halogen atoms, and the haloalkyl group preferably contains at least a fluorine atom, more preferably contains only a fluorine atom(s). The halogen atom of the haloalkyl group may substitute some or all of the hydrogen atoms of an alkyl group. Examples of the haloalkyl group include a fluoromethyl group, a 1-fluoromethyl group, a 2-fluoroethyl group, a 2-fluoroisobutyl group, a 1,2-difluoroethyl group, a difluoromethyl group, a trifluoromethyl group, a pentafluoroethyl group, a perfluoroisopropyl group, a perfluorobutyl group, and a perfluorocyclohexyl group. By using an electron-accepting haloalkyl group, the molecular arrangement and the wettability to a substrate to be coated can be controlled and the lowest unoccupied molecular orbital (LUMO) level can be reduced, allowing the organic transistor material to function as an n-type semiconductor.

The alkylcyclohexyl group and the skeleton X may or may not have a single phenyl group therebetween.

The alkyl group or haloalkyl group of the alkylcyclohexyl group and the skeleton X or the phenyl group are preferably arranged in the 1- and 4-positions of a cyclohexane ring. Further, a trans-form is preferred to a cis-form since it gives superior thermal stability to the organic transistor material.

The skeleton X has at least one alkylcyclohexyl group, and may have two alkylcyclohexyl groups. When there are two alkylcyclohexyl groups, the alkyl group constituting a side chain of a first alkylcyclohexyl group and the alkyl group constituting a side chain of a second alkylcyclohexyl group may have the same number of carbon atoms, or different numbers of carbon atoms. Regardless of whether or not there is a phenyl group between the first alkylcyclohexyl group and the skeleton X, the second alkylcyclohexyl group and the skeleton X may or may not have a single phenyl group therebetween.

The skeleton X is a skeleton used as an organic transistor material, specifically a skeleton in which plural phenylene groups or naphthylene groups are linked directly or via a vinyl group, a condensed polycyclic hydrocarbon skeleton, or a heterocyclic compound skeleton. More specifically, examples of these skeletons include skeletons represented by the below-described Formulae (2) to (50).

[Skeletons in which Plural Phenylene Groups or Naphthylene Groups are Linked Directly or Via Vinyl Group]

(Distyrylbenzene Skeleton)

(Binaphthyl Skeleton)

(Ternaphtyl Skeleton)

(4)

[Condensed Polycyclic Hydrocarbon Skeletons]

[Condensed Polycyclic Hydrocarbon Skeletons Containing Four Rings]

(Chrysene Skeleton)

(5)

(6)

(7)

(Pyrene Skeleton)

(8)

(9)

(10)

(Tetracene Skeleton)

(11)

[Condensed Polycyclic Hydrocarbon Skeletons Containing Five Rings]

(Picene Skeleton)

(12)

(13)

(14)

(Dibenzanthracene Skeleton)

(15)

(16)

(Pentacene Skeleton)

(17)

(18)

[Condensed Polycyclic Hydrocarbon Skeletons Containing Six Rings]

(Dibenzochrysene Skeleton)

(19)

(20)

(21)

[Heterocyclic Compound Skeletons]

[Condensed Heterocyclic Compound Skeletons Having One Sulfur Atom-Containing Heterocycle]

(22)

(23)

[Condensed Heterocyclic Compound Skeletons Having Two Sulfur Atom-Containing Heterocycles]

(Benzothienobenzothiophene Skeleton; BTBT Skeleton)

(24)

(25)

(26)

(27)

(28)

(Dinaphthothienothiophene Skeleton; DNTT skeleton)

(29)

(30)

(31)

(32)

(33)

(34)

(35)

(36)

(37)

(38)

(39)

(40)

(41)

(42)

[Condensed Heterocyclic Compound Skeletons Having Four Sulfur Atom-Containing Heterocycles]

(Di(benzothieno)thienothiophene Skeleton)

(43)

[Condensed Heterocyclic Compound Skeletons Having One Oxygen Atom-Containing Heterocycle]

(44)

(45)

[Condensed Heterocyclic Compound Skeletons Having Two Oxygen Atom-Containing Heterocycle]

(46)

(47)

(48)

[Condensed Heterocyclic Compound Skeletons Having Nitrogen Atom-Containing Heterocycles]

(49)

(50)

Among the above-described skeletons of Formulae (2) to (50), the skeleton X can be, for example, a chrysene skeleton, a benzothienobenzothiophene skeleton, a dibenzanthracene skeleton, or a dinaphthothienothiophene skeleton.

When the skeleton X is the chrysene skeleton of Formula (6), more specific examples can be the following Formulae (A-1) to (A-7). In these Formulae, $R_1$ and $R_2$ are each independently an alkyl group or haloalkyl group having 1 to 15 carbon atoms, preferably an alkyl group having 1 to 10 carbon atoms.

(A-1)

(A-2)

(A-3)

(A-4)

(A-5)

(A-6)

(A-7)

When the skeleton X is the dinaphthothienothiophene skeleton of Formula (29), more specific examples can be the following Formulae (B-1) to (B-7). In these Formulae, $R_1$ and $R_2$ are each independently an alkyl group or haloalkyl group having 1 to 15 carbon atoms, preferably an alkyl group having 1 to 10 carbon atoms.

(B-1)

(B-2)

(B-3)

(B-4)

(B-5)

(B-6)

(B-7)

Among the above-described skeletons of Formulae (2) to (50), the skeleton X is preferably the skeleton of Formula (2), (3), (4), (6), (7), (12), (13), (14), (15), (16), (19), (20), (21), (22), (23), (24), (25), (27), (28), (29), (30), (31), (32), (33), (35), (42), (44), (45), (46), (47), (48), (49), or (50) since this allows the organic semiconductor to stably operate over an extended period.

The above-described organic transistor material can be synthesized by a known method, examples of which include a Suzuki coupling reaction using a transition metal, a Sonogashira reaction using a copper catalyst, a desilylation reaction, a cyclization reaction using a transition metal, and a Negishi coupling reaction using a transition metal.

For the use of the organic transistor material in an organic transistor, the organic transistor material needs to be purified by removal of impurities and the like so as to improve the purity, and can be purified by, for example, a liquid chromatography method, a sublimation method, a zone melting method, a gel permeation chromatography method, or a recrystallization method.

Further, in an organic transistor, the organic transistor material is mainly utilized in the form of a thin film, and either a wet process or a dry process may be employed as a method of producing the thin film. The organic transistor material can be dissolved in an organic solvent or the like and thereby made suitable for a wet process that has a major industrial advantage.

As the organic solvent, any known organic solvent such as dichloromethane, chloroform, chlorobenzene, dichlorobenzene, cyclohexanol, toluene, xylene, anisole, cyclohexanone, nitrobenzene, methyl ethyl ketone, diglyme, or tetrahydrofuran can be used. When the organic transistor material is dissolved in an organic solvent or the like, the temperature and the pressure are not particularly limited; however, the temperature at which the organic transistor material is dissolved is preferably in a range of 0 to 200° C., more preferably in a range of 10 to 150° C., and the pressure at which the organic transistor material is dissolved is preferably in a range of 0.1 to 100 MPa, more preferably in a range of 0.1 to 10 MPa. It is also possible to use supercritical carbon dioxide or the like in place of the organic solvent.

The term "wet process" used herein refers to, for example, a spin coating method, a dip coating method, a bar coating method, a spray coating method, an ink-jet coating method, a screen printing method, a planographic printing method, an intaglio printing method, or a relief printing method, and any of these known methods can be employed.

The term "dry process" used herein refers to, for example, a vacuum deposition method, a sputtering method, a CVD method, a laser deposition method, a molecular beam epitaxial growth method, or a vapor-phase transport growth method, and any of these known methods can be employed.

Next, the input-output properties of the organic thin-film field-effect transistor according to the present invention will be described. A p-type field-effect transistor having the structure illustrated in FIG. 2 was produced as a trial. In this p-type field-effect transistor, the following compound was used as an organic transistor material. This compound is hereinafter referred to as "4H-21DNTT".

4H-21DNTT

Figure 4:
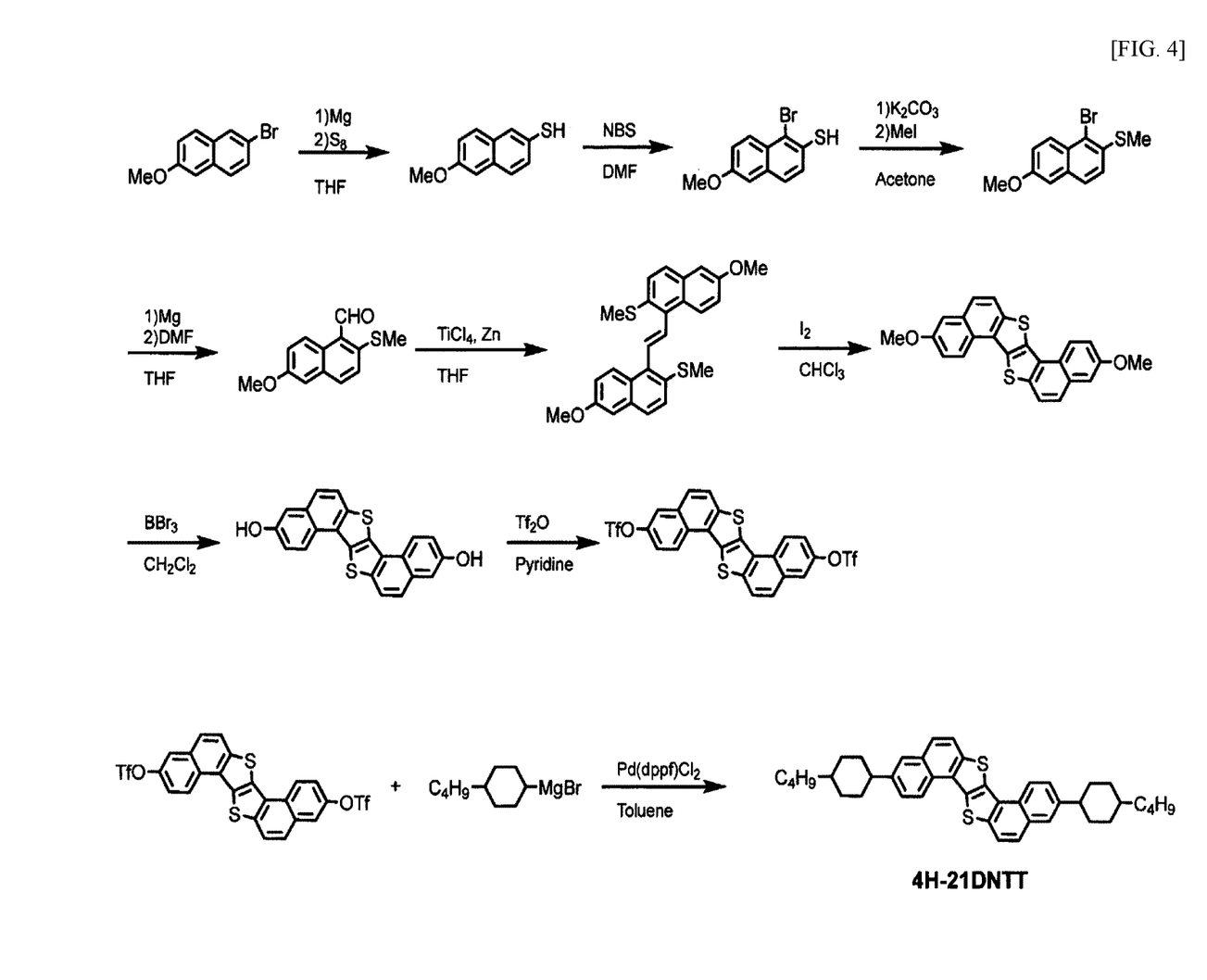
FIG. 4 shows one example of the reaction formula of an organic transistor material 4H-21DNTT that can be used in the present invention.

The above-described 4H-21DNTT can be synthesized in accordance with, for example, the reaction formula shown in FIG. 4.

Figure 3:
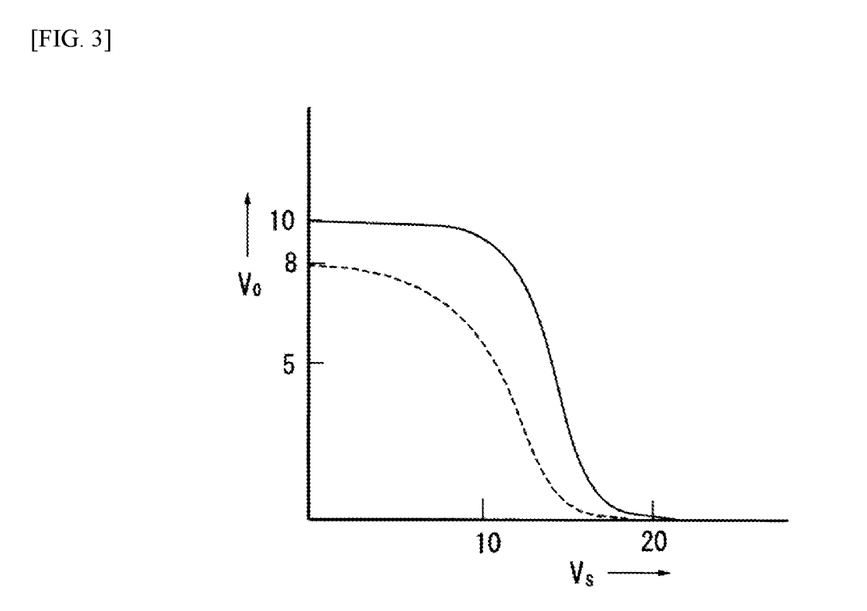
FIG. 3 is a graph showing one example of the amplification characteristics of the field-effect transistor according to the present invention.

The thus obtained p-type field-effect transistor was source-grounded to measure the input-output properties. The load resistance connected to the source electrode was 1 MΩ (represented by the dashed line in FIG. 3) or 10 MΩ (represented by the solid line in FIG. 3). FIG. 3 is a graph showing the results of measuring the input-output properties of the trial-produced organic thin-film field-effect transistor. The abscissa represents the bias voltage Vs applied to the gate electrode, while the ordinate represents the output voltage (source voltage) Vo. A drain voltage Vdd of 10 V was applied to the drain electrode.

Referring to FIG. 3, when the load resistance was 10 MΩ, the output voltage rapidly decreased once the bias voltage exceeded 10 V, showing a large change in the output voltage Vo for a small change in the input voltage Vs. Also when the load resistance was 1 MΩ, it was confirmed that the output voltage largely changed with a small change in the input voltage in the same manner.

As apparent from the measurement results shown in FIG. 3, it was demonstrated that the organic thin-film field-effect transistor according to the present invention attains a high output voltage property with respect to a small change in the input voltage and exerts a voltage amplification effect.

As a p-type field-effect transistor, in addition to the above-described 4H-21DNTT, the following compound 5H-21DNTT has also been demonstrated to attain a high output voltage property with respect to a small change in the input voltage and exert a voltage amplification effect.

5H-21DNTT

This 5H-21DNTT can be synthesized in the same manner as 4H-21DNTT, except that 1-bromo-4-butylcyclohexane is changed to 1-bromo-4-pentylcyclohexane in the reaction formula of 4H-21DNTT shown in FIG. 4.

The present invention is not limited to the above-described working example and can be carried out with various modifications and changes. For example, in the above-described working example, a MOS organic field-effect transistor was used as an organic thin-film semiconductor amplifier element; however, it is needless to say that a junction organic field-effect transistor can be used as well.

As for the structure of the field-effect transistor, not only a bottom-gate field-effect transistor but also a top-gate field-effect transistor can be used. It is also possible to use a top-contact or bottom-contact field-effect transistor.

As an organic semiconductor, a variety of organic semiconductor materials other than the one used in the working example, such as pentacene and tetracene, can be used.

As an analog amplifier, the present invention can be applied to various audio amplifiers. For example, the present invention can also be applied to an amplifier device that includes a preamplifier performing voltage amplification and a main amplifier performing power amplification and, in this case, an organic field-effect transistor is arranged in the preamplifier performing voltage amplification.

DESCRIPTION OF SYMBOLS

1: record player
2: first amplifier
3: step-up transformer
4: organic amplifier element
5: power source
6: second amplifier
7: intermediate amplifier
8: attenuator
9: power amplifier
10: speaker

What is claimed is:
1. An analog amplifier comprising:
a first amplifier for voltage-amplifying an input analog signal; and
a second amplifier for power-amplifying the thus amplified signal output from the first amplifier to generate a drive signal for driving an equipment,
wherein the first amplifier comprises an organic semiconductor amplifier element in which a semiconductor layer forming a channel comprises an organic semiconductor, wherein the organic semiconductor amplifier element comprises an organic thin-film field-effect transistor comprising an organic semiconductor layer forming a channel, a source electrode, and a drain electrode, which are in contact with the organic semiconductor layer and face each other via a channel region; and a gate electrode facing the channel region.

2. The analog amplifier according to claim 1, wherein the organic thin-film field-effect transistor is a MOS organic field-effect transistor in which the gate electrode faces the channel region via a gate insulating film.

3. The analog amplifier according to claim 1, wherein the input analog signal is an audio signal output from a sound reproduction device, the audio signal is voltage-amplified by the first amplifier, the second amplifier power-amplifies the thus voltage-amplified audio signal to generate a drive signal for driving an audio equipment, and the analog amplifier operates as an audio amplifier.

4. The analog amplifier according to claim 3, wherein the input analog signal is an audio signal generated from a cartridge of a record player, the first amplifier comprises a series connection of a step-up transformer and an organic thin-film field-effect transistor, and the input analog signal is amplified by the step-up transformer and then further amplified by the organic thin-film field-effect transistor.

5. The analog amplifier according to claim 1, wherein the organic semiconductor is an organic transistor material having a trans-1,4-cyclohexane structure derived from a compound represented by the following Formula (1):

where

X represents a skeleton in which plural phenylene groups or naphthylene groups are linked directly or via a vinyl group, a condensed polycyclic hydrocarbon skeleton, or a heterocyclic compound skeleton;

m, n, p, and q each independently represent 0 or 1; and

R1 and R2 each independently represent an alkyl group or haloalkyl group having 1 to 15 carbon atoms.

* * * * *